(12) United States Patent
Charles

(10) Patent No.: US 10,522,648 B2
(45) Date of Patent: Dec. 31, 2019

(54) METHOD FOR MANUFACTURING ELECTRONIC COMPONENT FOR HETEROJUNCTION PROVIDED WITH BURIED BARRIER LAYER

(71) Applicant: Commissariat a l'energie atomique et aux energies alternatives, Paris (FR)

(72) Inventor: Matthew Charles, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/150,649

(22) Filed: Oct. 3, 2018

(65) Prior Publication Data

US 2019/0109209 A1   Apr. 11, 2019

(30) Foreign Application Priority Data

Oct. 3, 2017   (FR) .................................... 17 59218

(51) Int. Cl.
*H01L 29/66*   (2006.01)
*H01L 21/02*   (2006.01)
(Continued)

(52) U.S. Cl.
CPC ........ *H01L 29/66462* (2013.01); *C30B 25/10* (2013.01); *C30B 25/16* (2013.01);
(Continued)

(58) Field of Classification Search
CPC ........... H01L 29/66462; H01L 29/1083; H01L 29/36; H01L 29/4236; H01L 29/205;
(Continued)

(56) References Cited

U.S. PATENT DOCUMENTS 7,449,404 B1   11/2008 Creighton et al.
8,796,738 B2 *   8/2014 Briere ................. H01L 21/0237
257/194
(Continued)

FOREIGN PATENT DOCUMENTS

WO   WO 2009/148930 A1   12/2009

OTHER PUBLICATIONS

French Preliminary Search Report dated Jun. 4, 2018 in French Application 17 59218 filed on Oct. 3, 2017 (with English Translation of Categories of Cited Documents and Written Opinion).
(Continued)

*Primary Examiner* — Eva Y Montalvo
*Assistant Examiner* — Victor V Barzykin
(74) *Attorney, Agent, or Firm* — Oblon, McClelland, Maier & Neustadt, L.L.P.

(57) ABSTRACT

The invention relates to a process for manufacturing a heterojunction electronic component provided with an embedded barrier layer, the process comprising: depositing by epitaxy, in a vapour phase epitaxial growth chamber with an atmosphere exhibiting a first nonzero ammonia concentration, of a GaN precursor layer of the embedded barrier layer, comprising a first layer doped with a Mg or Fe dopant; placing, while maintaining the substrate in the chamber, the atmosphere at a second ammonia concentration at most equal to a third of the first concentration, in order to remove an upper part of the precursor layer; and then after the removal of the said upper part, while maintaining the substrate in the chamber, depositing by epitaxy of a layer of semiconductor material of the heterojunction electronic component to be manufactured, the said precursor layer then forming the embedded barrier layer under the said layer of semiconductor material.

8 Claims, 6 Drawing Sheets

(51) Int. Cl.
  *H01L 21/205* (2006.01)
  *H01L 29/205* (2006.01)
  *C30B 25/10* (2006.01)
  *C30B 25/16* (2006.01)
  *C30B 25/18* (2006.01)
  *C30B 29/40* (2006.01)
  *C30B 33/12* (2006.01)
  *H01L 21/306* (2006.01)
  *H01L 29/20* (2006.01)
  *H01L 29/423* (2006.01)
  *H01L 29/778* (2006.01)

(52) U.S. Cl.
  CPC .......... *C30B 25/183* (2013.01); *C30B 29/406* (2013.01); *C30B 33/12* (2013.01); *H01L 21/0254* (2013.01); *H01L 21/0262* (2013.01); *H01L 21/02458* (2013.01); *H01L 21/02505* (2013.01); *H01L 21/02579* (2013.01); *H01L 21/02634* (2013.01); *H01L 21/2056* (2013.01); *H01L 21/30621* (2013.01); *H01L 29/2003* (2013.01); *H01L 29/205* (2013.01); *H01L 29/4236* (2013.01); *H01L 29/66522* (2013.01); *H01L 29/7787* (2013.01)

(58) Field of Classification Search
  CPC ........... H01L 29/7787; H01L 29/66522; H01L 21/2056; H01L 21/02634; H01L 21/0262; H01L 29/2003; H01L 21/0254; H01L 21/02458

See application file for complete search history.

(56) References Cited

U.S. PATENT DOCUMENTS

| | | | |
|---|---|---|---|
| 2011/0073874 A1 | 3/2011 | Loboda | |
| 2013/0069208 A1* | 3/2013 | Briere | H01L 21/0237 257/655 |
| 2014/0045306 A1* | 2/2014 | Bour | H01L 21/02389 438/192 |
| 2014/0264370 A1* | 9/2014 | Keller | H01L 29/207 257/76 |
| 2018/0069085 A1* | 3/2018 | Laboutin | H01L 21/02381 |
| 2018/0204941 A1* | 7/2018 | Odnoblyudov | H01L 21/02499 |

OTHER PUBLICATIONS

Huili Xing, et al., "Memory Effect and Redistribution of Mg into Sequentially Regrown GaN Layer by Metalorganic Chemical Vapor Deposition," Japanese Journal of Applied Physics vol. 42, Part 1, No. 1, 2003, 5 Pages.

S. Heikman, et al., "Growth and characteristics of Fe-doped GaN," Journal of Crystal Growth 248, 2003, pp. 513-517.

Y. Ohba, et al., "A study on strong memory effects for Mg doping in GaN metalorganic chemical vapor deposition," Journal of Crystal Growth 145, 1994, pp. 214-216.

* cited by examiner

METHOD FOR MANUFACTURING ELECTRONIC COMPONENT FOR HETEROJUNCTION PROVIDED WITH BURIED BARRIER LAYER

The invention relates to heterojunction electronic components which are provided with an embedded barrier layer separating them from their substrate and in particular to processes for the manufacture of such components and of their barrier layer.

Numerous electronic applications will now require an improvement in performance qualities, especially in on-board electronics intended for cars and ground-based means of transportation, in aeronautics, in medical systems or in home automation solutions, for example. These applications for the most part require high-power switches functioning in frequency ranges frequently of greater than one megahertz.

An alternative for power switches, in particular high-frequency power switches, is the use of high-electron-mobility field-effect transistors, also denoted by the term of heterostructure field-effect transistor. Such a transistor includes the superimposition of two semiconductor layers having different bandgaps which form a quantum well at their interface. Electrons are confined in this quantum well in order to form a two-dimensional electron gas. For reasons of high-voltage and temperature withstand, these transistors are chosen so as to exhibit a wide energy bandgap.

Among HEMT transistors having a wide energy bandgap, transistors based on gallium nitride are very promising. The width of their energy bandgap results in a higher critical electric field compared to conventional electronic materials, in a high carrier saturation velocity and in good thermal and chemical stabilities. The breakdown field of gallium nitride can thus be greater than $2\times10^6$ V/cm, which makes it possible to easily produce compact transistors with breakdown voltages of greater than 600 V. With a lateral conduction transistor, the gate-drain breakdown voltage can easily be controlled by an appropriate distance between gate and drain. Furthermore, such transistors make possible very high current densities as a result of the very high electron mobility and the high electron density in the interfacial electron gas.

Furthermore, other heterojunction components, such as diodes, are also the subject of major developments.

The document "Characteristics of AlGaN/GaN/AlGaN double heterojunction HEMTs with an improved breakdown voltage", published in the January 2012, Volume 33, Number 1, vissue of Journal of Semiconductors, describes a first HEMT transistor structure. This structure comprises a SiC substrate, surmounted by a 100 nm AlN nucleation layer, surmounted by a 1.5 µm GaN buffer layer, surmounted by a 1 nm AlN intermediate layer, surmounted by a 22 nm AlGaN layer, surmounted by a 1 nm GaN layer, on which the source, the gate and the drain of the transistor are formed. An electron gas layer is formed at the interface between the GaN buffer layer and the AlGaN layer, the AlN intermediate layer being regarded as belonging to this interface.

In practice, the GaN buffer layer exhibits a relatively low potential barrier, so much so that electrons of the electron gas layer can easily leave the potential well to be trapped in the GaN buffer layer, for example in the case where the transistor is off. The conduction performance of the transistor is then greatly diminished because the electron density is reduced.

The proposal has been made to form a barrier layer of pGaN type between the buffer layer and the heterojunction component, by including magnesium in the barrier layer at a not insignificant proportion in order to limit the departure of the electrons out of the potential well, by raising the conduction band. Magnesium is typically chosen as a result of its low ionization energy among p-type dopants. Such a barrier layer of pGaN type is usually deposited by vapour phase epitaxial growth on the buffer layer, in the presence of magnesium in the reactor.

However, it is found that a GaN layer of the component, formed on the pGaN barrier layer, includes a not insignificant amount of magnesium, which is generally denoted by the term of magnesium memory effect in the literature. The magnesium doping profile at the interface between the pGaN barrier layer and the GaN layer of the heterojunction component thus slowly decreases on moving away from the barrier layer. A GaN thickness of 100 nm proves to be necessary in order to reduce the magnesium concentration by a factor of ten in the GaN layer above the barrier layer. In such a scenario, the barrier layer satisfactorily performs its confinement function but the magnesium present in the GaN layer located above detrimentally affects the mobility in the electron gas layer of the component. The conduction resistance of the component then significantly increases. Furthermore, the magnesium of this GaN layer can trap electrons and increase the resistance of the channel in dynamic operation, which is known as "current collapse".

The document entitled "Memory effect and redistribution of Mg into sequentially regrown GaN layer by Metalorganic Chemical Vapor Deposition", published in the Japanese Journal of Applied Physics in January 2003 by Huili Xing et al., describes a process for the deposition of a magnesium-including pGaN layer, followed by the maintenance in a gallium-free atmosphere of hydrogen, nitrogen and ammonia, which results in a slow etching of the upper surface of the barrier layer and in an annealing of the pGaN layer. Such a process proved to be ineffective in obtaining a rapid decrease in the concentration of magnesium in the GaN layer subsequently deposited on the barrier layer. The document alternatively provides for removing the substrate, provided with the barrier layer, from the epitaxial growth chamber and for then carrying out a stage of etching with acid of the upper part of the barrier layer.

Such a process presents major problems of upgrading to the industrial scale and may result in contamination of the upper surface of the barrier layer before further deposition stages. Such a contamination of the upper surface of the barrier layer, in particular by oxygen, may result in a major detrimental change in the electrical properties of the component formed on this barrier layer.

It is also observed that, during the start-up of the epitaxial growth of the barrier layer, a deposition thickness of 100 nm of pGaN proves to be necessary before achieving a sufficient magnesium concentration in this pGaN layer.

The invention is targeted at overcoming one or more of these disadvantages. The invention thus relates to a process for the manufacture of a heterojunction electronic component provided with an embedded barrier layer, as defined in the appended claims.

The invention also relates to the alternative forms of the dependent claims. A person skilled in the art will understand that each of the characteristics of the alternative forms of the dependent claims can be independently combined with the characteristics of an independent claim, without, however, constituting an intermediate generalization.

Other characteristics and advantages of the invention will become clearly apparent from the description which is given below thereof, by way of indication and without any limitation, with reference to the appended drawings, in which.

Figure 1:
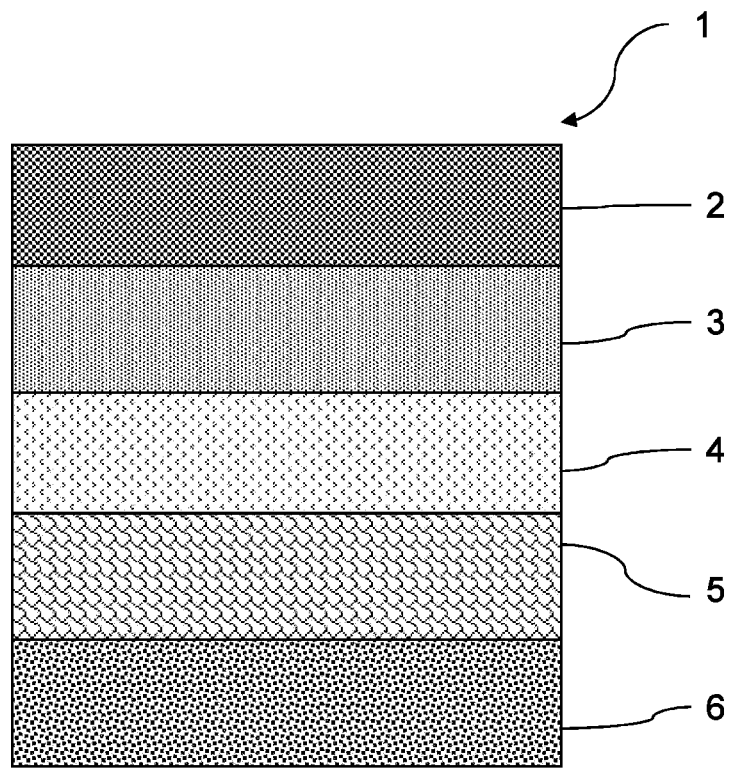
FIG. 1 is a diagrammatic sectional view of a heterojunction electronic component provided with an embedded barrier layer for separation from its substrate.

FIG. 1 is a diagrammatic cross-sectional view of a multilayer structure 1, produced by a manufacturing process according to the invention. The multilayer structure 1 comprises a heterojunction electronic component 2, formed on a barrier layer 3. The barrier layer 3 is in this instance formed on a layer 4 of GaN semiconductor material. The layer 4 is formed on a buffer layer 5, itself attached to a substrate 6.

The high-electron-mobility heterojunction electronic component 2 can, for example, be a HEMT-type transistor (normally-on or normally-open) or a heterojunction diode.

The substrate 6 exhibits a structure known per se. The substrate 6 can be an insulator, an intrinsic or doped silicon-type semiconductor, SiC, sapphire or even AlN. The substrate 6 can typically exhibit a thickness of the order of 350 μm to 1.5 mm.

An adaptation layer, not illustrated, can be interposed between the substrate 6 and the buffer layer 5, The buffer layer 5 is, for example, made of carbon-doped GaN or includes $Al_xGa_{(1-x)}N$ layers or other nitride layers. The GaN layer 4 is, for example, formed of GaN of not intentionally doped type, or carbon-doped type, or also an $Al_xGa_{(1-x)}N$ layer. The barrier layer 3 comprises at least one GaN layer having p-type doping, the p-type dopant being magnesium.

Figure 2:
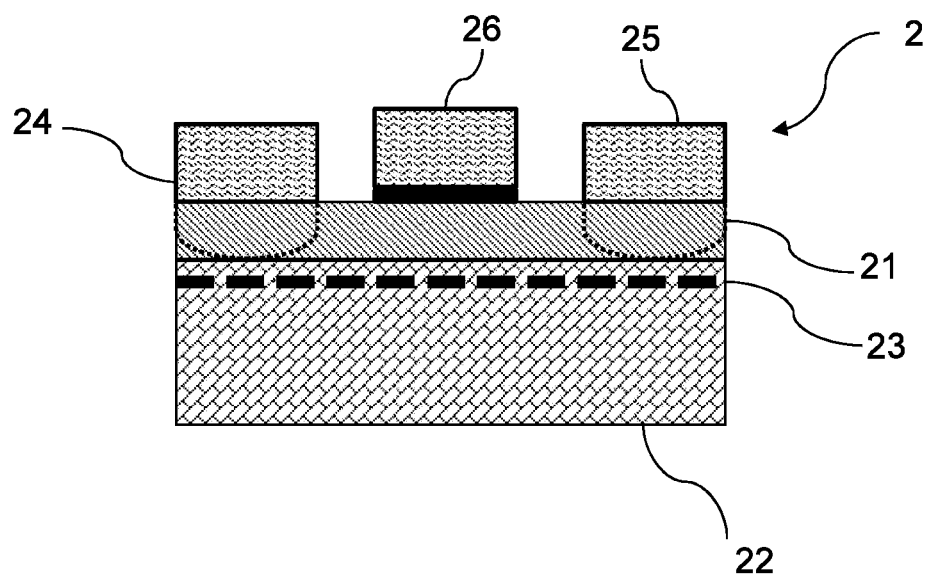
FIG. 2 is a diagrammatic sectional view of an example of HEMT transistor which can be formed on a barrier layer.

FIG. 2 is a diagrammatic sectional view of an example of electronic component 2, of high-electron-mobility transistor type of normally-on type, which means that, without applying a voltage to the gate, the channel is on. The transistor 2 in this instance comprises a not intentionally doped layer of GaN 22 positioned on the barrier layer 3. The transistor 1 in this instance additionally comprises a layer of AlGaN (or InAlN or InGaAlN or AlN, with a greater bandgap than that of GaN) 21 positioned on the layer 22. An electron gas is intrinsically formed by heterojunction at the interface between the layer 21 and the layer 22, in the layer 22. For the sake of legibility, the electron gas is illustrated in the form of a layer 23.

An intermediate layer, not illustrated, can be interposed, in a way known per se, between the layers 21 and 22, for example in order to increase the electron density and the mobility in the electron gas. Such an intermediate layer is typically extremely thin (for example 1 nm) and can be made of AlN (particularly suited to the interface between a GaN layer 22 and an AlGaN layer 21).

In a way known per se, the transistor 2 is in this instance of the lateral conduction type and comprises a source 24, a drain 25 and a control gate 26 which are formed, in a way known per se, on the AlGaN layer 21. The control gate 26 is positioned between the source 24 and the drain 25, The source 24 and the drain 25 are electrically connected to the electron gas layer 23. The source 24, the drain 25 and the control gate 26 are illustrated only diagrammatically, it being possible for their dimensions and their structures to differ substantially from the illustration of FIG. 2.

The barrier layer 3 might be made of magnesium-doped pGaN. In this case, the lower part of the layer of not intentionally doped GaN 22 has a tendency to include magnesium originating from the process of epitaxy of the barrier layer 3. The influence of this magnesium on the electron mobility of the electron gas layer 23 has to be limited as much as possible, if possible while preventing increasing the thickness of the GaN layer 22. The thickness of the GaN layer 22 is to be minimized, in particular in order to promote the performance of transistors of normally-off type.

FIGS. 3 to 7 are diagrammatic sectional views illustrating different stages of a manufacturing process according to a first embodiment of the invention.

Figure 3:
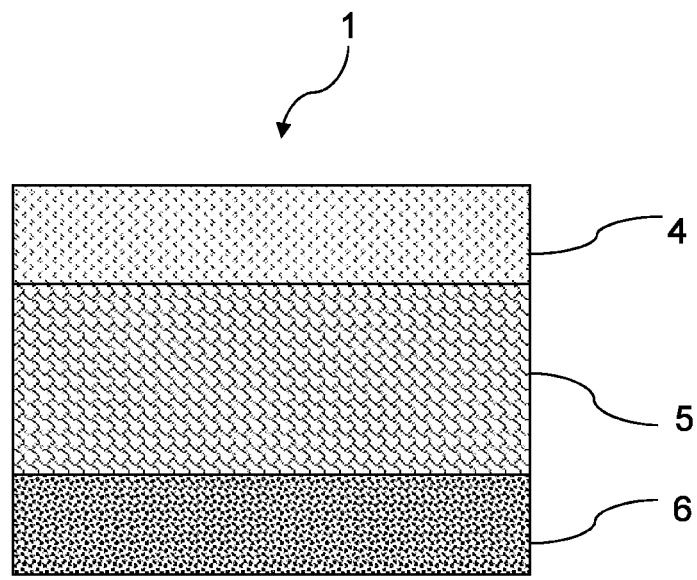
FIGS. 3 to 7 are diagrammatic sectional views of different stages of a manufacturing process according to a first embodiment of the invention.

In FIG. 3, a multilayer structure 1, provided with a substrate 6 surmounted by a buffer layer 5 and by a GaN layer 4, such as are described above and which can be obtained by processes known per se, is supplied.

Figure 4:
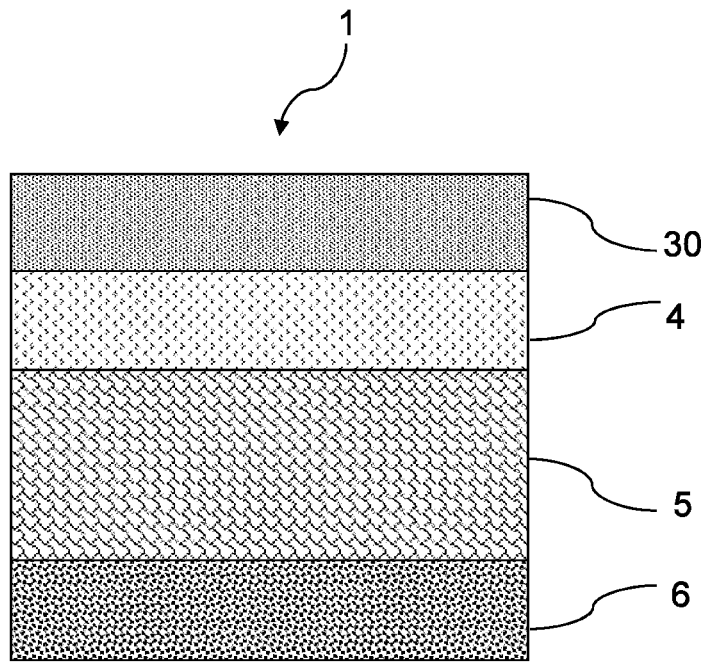

In FIG. 4, a pGaN layer 30 is deposited, according to parameters known per se. For example, on placing the structure 1 in a vapour phase epitaxial growth chamber (not illustrated), a gas atmosphere is created in the chamber, with a mixture including precursors of gallium (for example TMGa), magnesium (for example $Cp_2Mg$), ammonia, hydrogen and nitrogen. The ammonia partial pressure in the mixture is typically between 4000 and 6000 Pa for this stage. The concentration of a gas in the atmosphere inside the chamber can be expressed as the ratio of the partial pressure of this gas to the total pressure in the chamber. The magnesium partial pressure is set at a level which makes it possible to obtain the magnesium concentration desired for the barrier layer. It is possible, for example, to target a mean magnesium concentration at least equal to $1*10^{17}$ cm$^{-3}$, indeed even at least equal to $1*10^{18}$ cm$^{-3}$, in the barrier layer 3. The temperature in the chamber in order to carry out the epitaxial growth of the layer 30 is, for example, 1050° C. The pGaN layer 30 can advantageously be deposited over a thickness of between 90 and 250 nm.

Figure 5:
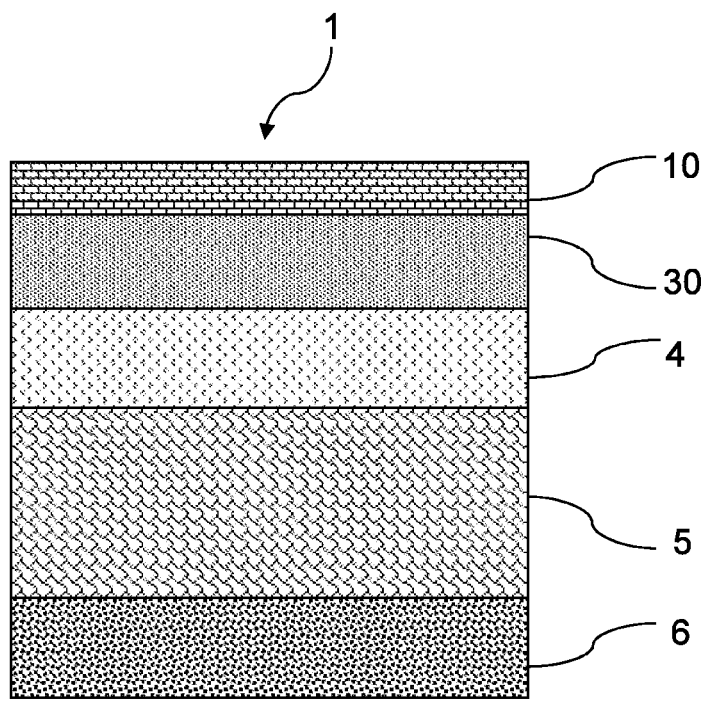

FIG. 5 illustrates another stage of the manufacturing process according to the first embodiment. While maintaining the structure 1 in the vapour phase epitaxial growth chamber, the gas atmosphere in the chamber is modified by halting the feeding of the atmosphere of the chamber with magnesium. The chamber is thus maintained in an epitaxial growth gas atmosphere with a mixture including gallium, ammonia, molecular hydrogen and nitrogen. A GaN layer 10 is thus deposited on the pGaN layer 30, with conditions of formation of a layer of not intentionally doped type. The combination of the pGaN layer 30 and of the GaN layer 10 forms a precursor layer of the barrier layer in the course of manufacture.

The ammonia partial pressure in the mixture for the deposition of the layer 10 is typically between 4000 and 6000 Pa for this stage. The temperature in the chamber in order to carry out the epitaxial growth of the layer 10 is, for example, 1050° C. The GaN layer 10 can advantageously be deposited over a thickness of between 50 and 120 nm. As a result of the memory effect of the magnesium used during the deposition of the layer 30, the layer 10 also includes magnesium. The magnesium concentration decreases in the layer 10 as the distance from its interface with the layer 30 increases.

Figure 6:
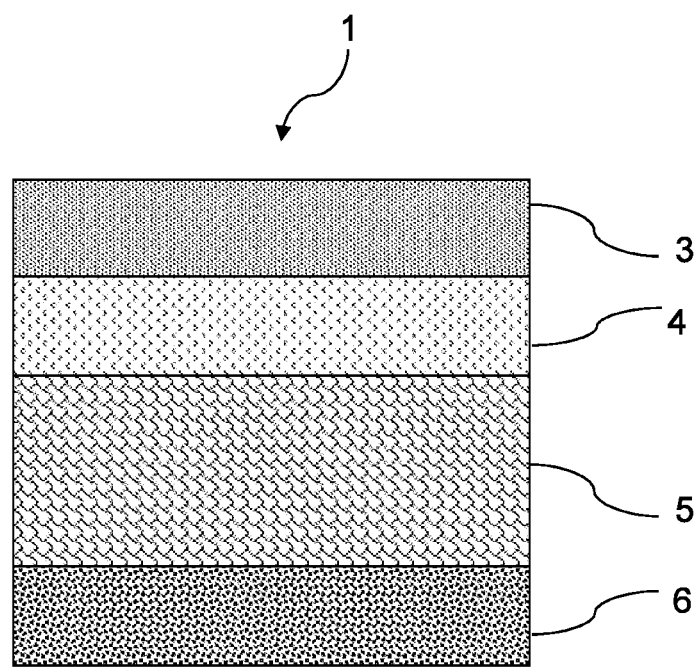

In order to obtain the configuration illustrated in FIG. 6, the multilayer structure 1 was maintained in the epitaxial growth chamber. The atmosphere inside the chamber is then placed under conditions for removal of the layer 10 and/or of the upper part of the layer 30. The atmosphere inside the chamber for this removal stage in this instance exhibits an ammonia concentration Cg1 at most equal to a third of the ammonia concentration Cd1 of the atmosphere during the deposition of the layer 30. Advantageously, the concentration Cg1 is at most equal to 10% of the concentration Cd1. The removal stage comprises, in this instance, the removal of the whole of the layer 10. The removal is carried out by a mechanism of desorption of the layer 10.

Advantageously, the ammonia concentration Cg1 in the atmosphere during this removal stage is not zero, in order to stabilize the etching/removal process. The ammonia concentration Cg1 in the atmosphere inside the chamber for this removal stage can, for example, be at least equal to 4% of the concentration Cd1 and can, for example, be equal to 5% of the concentration Cd1.

The removal of the upper part of the precursor layer is advantageously carried out over a thickness at least equal to 20 nm, in order to favour the front of decrease in the magnesium concentration.

The atmosphere used to carry out this removal stage comprises molecular hydrogen and this removal is carried out at a temperature of 1050° C. With such removal conditions, a rate of etching of 12 µm/h was obtained for the layer 10 with a zero ammonia concentration Cg1, and a rate of etching of 2 µm/h was obtained for the layer 10 with an ammonia partial pressure of between 200 and 300 Pa.

As illustrated in FIG. 6, the embedded barrier layer 3 was then encountered.

Figure 7:
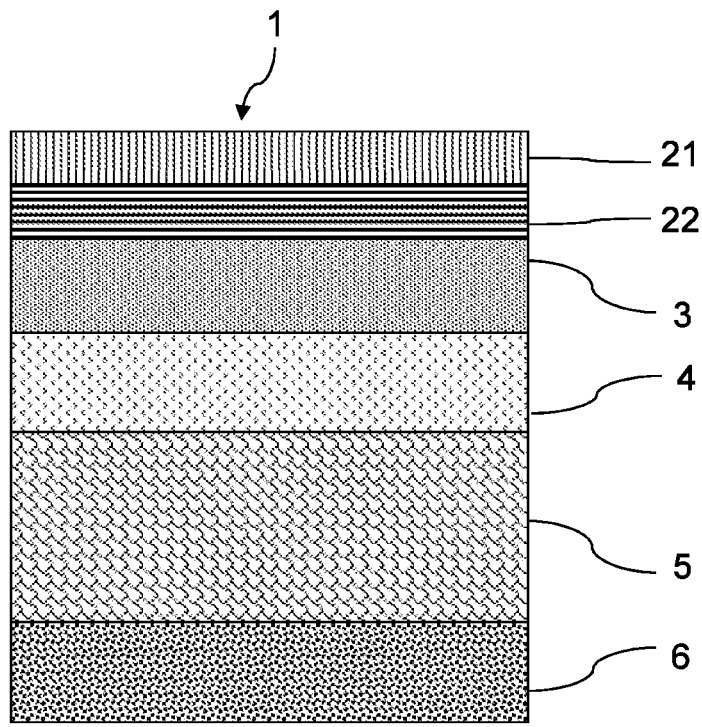

In FIG. 7, a layer of semiconductor material of the component to be formed was deposited on the barrier layer 3. In the example illustrated, a GaN layer 22 of not intentionally doped type was deposited by epitaxy on the barrier layer 3. An AlGaN layer 21 was subsequently deposited by epitaxy on the layer 22, so as to form an electron gas layer at their interface. Additional stages of a process for the manufacture of the transistor 2 from the layers 21 and 22 will not be described further in detail (formation of a source, of a drain and of a gate of the transistor 2, for example), these stages being known per se by a person skilled in the art.

Figure 9:
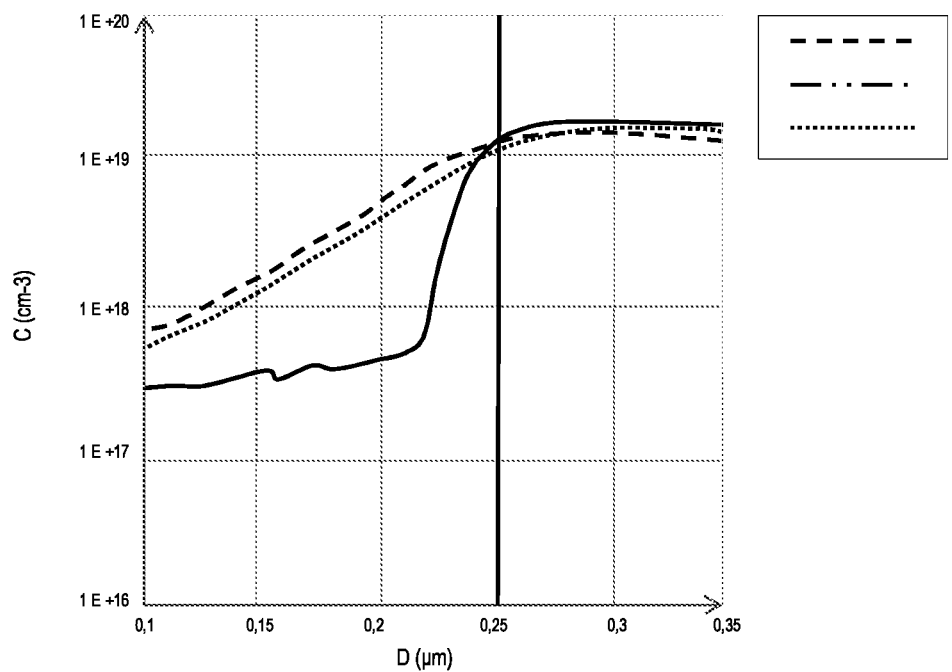
FIG. 9 is a comparative diagram of the magnesium concentration in the thickness of an integrated circuit, as a function of its process of manufacture.

FIG. 9 is a comparative diagram of the magnesium concentration C as a function of the position D in the depth of a multilayer structure and as a function of its process of manufacture. A zero depth D corresponds to the upper face of the layer 21 of the heterojunction transistor 2. A depth of 0.25 µm corresponds to the interface between the barrier layer 3 and the GaN layer 22. The broken-line curve corresponds to a structure produced according to a process of the state of the art, in which the GaN layer 22 is deposited by epitaxy immediately after the deposition by epitaxy of the pGaN layer of the barrier layer 3. The dotted-line curve corresponds to an integrated circuit produced according to a process of the state of the art, in which an annealing of 5 minutes is carried out between the deposition of the barrier layer 3 and the deposition of the GaN layer 22, the gallium (TMGa) being removed from the atmosphere of the chamber during this annealing. The continuous-line curve corresponds to a structure 1 obtained with a manufacturing process according to the first embodiment.

It is found, on the one hand, that a GaN thickness of at least 100 nm proves to be necessary for a process according to the state of the art, in order to reduce the magnesium concentration by a factor of ten with respect to its interface with the barrier layer 3. Even with a process according to the state of the art employing an annealing stage, such a GaN thickness proves to be necessary in order to reduce the magnesium concentration by a factor of ten with respect to the interface with the barrier layer 3.

In contrast, it is found that the magnesium concentration falls by a factor of ten with a GaN thickness of approximately 30 nm for a structure 1 produced according to the first embodiment.

The manufacturing process according to the invention thus makes it possible to increase the slope of decrease in the magnesium concentration in the layer of semiconductor material formed on the barrier layer 3. According to the invention, the slope of decrease in the magnesium concentration in the layer of semiconductor material formed on the barrier layer 3 is thus particularly steep. The electron mobility in the electron gas layer of the component 2 formed on the barrier layer 3 is thus greatly improved, this being the case even with a relatively thin layer 22. With a barrier layer 3 exhibiting a very abrupt magnesium concentration front, it is possible to limit to the maximum the thickness of this barrier layer 3 while retaining a particularly effective potential barrier function.

Figure 11:
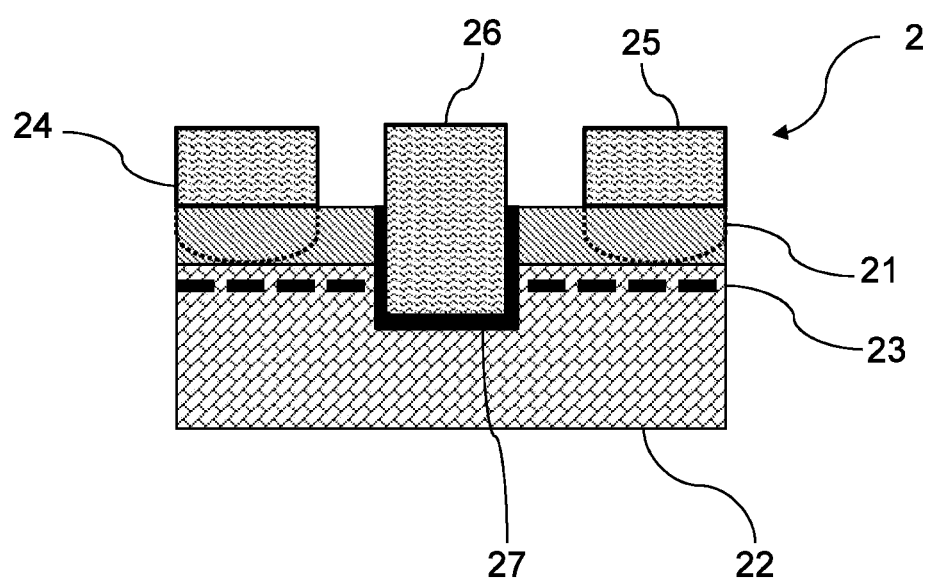
FIG. 11 is a diagrammatic sectional view of another example of HEMT transistor which can be formed on a barrier layer.

This can prove to be particularly advantageous for a transistor of normally-off type (as illustrated diagrammatically in FIG. 11) with a gate formed in a recess 27 passing through the AlGaN layer 21 and extending as far as into the GaN layer 22. This is because it is then possible to envisage reducing the thickness of the GaN layer 22 in which the conduction is carried out by inversion and not via the electron gas layer. It is advantageous to reduce the thickness of the layer 22 in order to prevent high resistances on the sides of the gate between the two-dimensional gas and the inversion layer under the gate.

In order to further increase the rate of decrease in the magnesium concentration above the barrier layer 3, and in order to better control the thickness removed from the layer 10, the process advantageously employs an alternation of stages of:

partial removal of the layer 10;
growth by epitaxy of a GaN layer, with conditions of formation of a layer of not intentionally doped type.

It is possible, for example, to envisage employing at least approximately ten alternations of such stages.

The removal stage is in this instance advantageously carried out while maintaining a certain ammonia concentration in the atmosphere of the chamber. Such a removal makes it possible both to obtain a removal rate which is sufficiently high to carry out an industrial process rapidly and sufficiently low to fully control the removal process. Furthermore, such a removal can be carried out under the same temperature conditions as the deposition of the layer 30, which makes it possible to avoid requiring a prior cooling of the structure.

However, it is also possible to envisage carrying out a removal with another atmosphere in the chamber, on conclusion of the deposition by epitaxy of the precursor layer of the barrier layer 3. It is possible, for example, to introduce $Cl_2$ or HCl into the chamber in order to carry out the removal stage.

A second embodiment of the invention can also be carried out. The second embodiment can employ the preliminary processing stages described with reference to FIG. 3.

Figure 8:
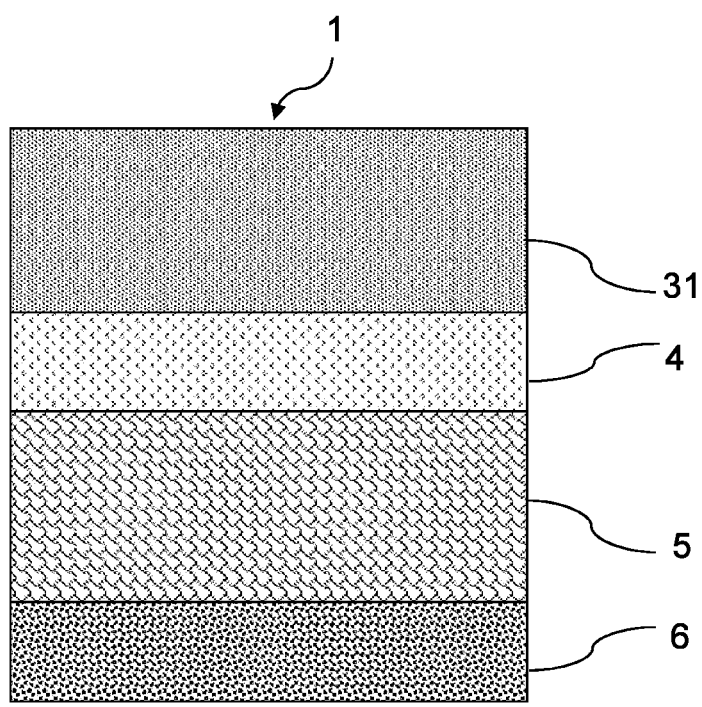
FIG. 8 is a diagrammatic sectional view of a stage of a manufacturing process according to a second embodiment of the invention.

In FIG. 8, a pGaN layer 31 is deposited, according to parameters known per se. The pGaN layer 31 forms in this instance the precursor layer of the barrier layer 3. The layer 31 is in this instance thicker than the layer 30 of the first embodiment. The layer 31 comprises a sacrificial part.

The deposition by epitaxy of the layer 31 is carried out, for example, by placing the multilayer structure 1 in the vapour phase epitaxial growth chamber, while creating a gas atmosphere in the chamber, with a mixture including gallium, magnesium, ammonia, molecular hydrogen and nitrogen. The ammonia partial pressure in the mixture is typically between 4000 and 6000 Pa for this stage. The temperature in the chamber in order to carry out the epitaxial growth of the layer 31 is, for example, 1050° C. The pGaN layer 31 can advantageously be deposited over a thickness of between 190 and 350 nm.

The process as described with reference to FIGS. 6 and 7 of the first embodiment can subsequently be taken up again, the removal of the upper part of the layer 31 being carried out in place of the removal of the layer 10. The multilayer structure 1 is thus maintained in the epitaxial growth chamber. The atmosphere inside the chamber is placed under conditions for removal of the layer 31. The atmosphere inside the chamber for this removal stage in this instance exhibits an ammonia concentration Cg1 at most equal to a third of the ammonia concentration Cd1 of the atmosphere during the deposition of the layer 31. Advantageously, the concentration Cg1 is at most equal to 10% of the concentration Cd1. The removal stage comprises, in this instance, the removal of a thickness of 100 nm from the layer 31, The removal is carried out by a mechanism of desorption of the upper part of the layer 31.

According to another independent aspect of the invention, the stage of formation of the precursor layer of the barrier layer 3 can be carried out in such a way that the magnesium concentration front in the bottom of this barrier layer 3 is very steep. With such a steep front, an even thinner barrier 3 can be used.

To this end, the stage of deposition of the pGaN precursor layer described in detail with reference to FIG. 4 can be carried out in the following way. When the multilayer structure 1 is positioned in the vapour phase epitaxial growth chamber, the surface of the layer is saturated beforehand with magnesium, before the conditions for growth by epitaxy of the pGaN precursor layer have been established. The addition of the magnesium precursor to the chamber, in order to achieve saturation with magnesium of the surface, can advantageously be carried out for a period of time at least equal to 10 seconds, Once the surface has been saturated with magnesium, the deposition of the pGaN layer with conditions for growth by epitaxy as described with reference to FIG. 4 is initiated. Saturation is carried out by dispatching the magnesium precursor without dispatching the gallium precursor, or with very little gallium precursor.

Figure 10:
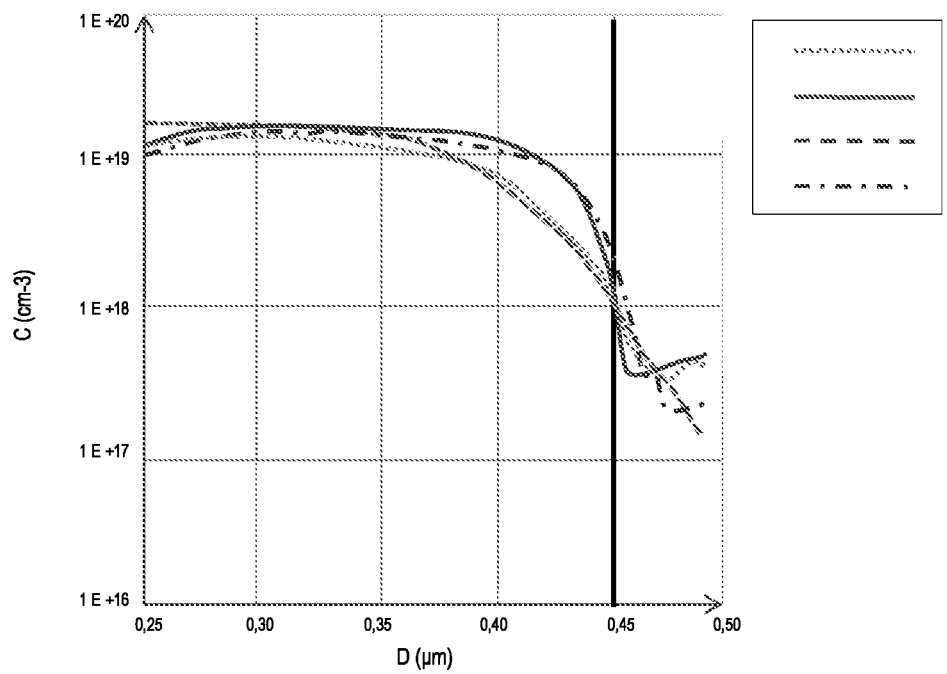
FIG. 10 is a comparative diagram of the magnesium concentration in the thickness of a barrier layer, as a function of alternative forms of manufacturing processes according to another aspect of the invention.

FIG. 10 illustrates a comparative diagram of the magnesium concentration in the thickness of the barrier layer 3 as a function of the duration of maintenance of the atmosphere in magnesium, prior to the deposition by epitaxy of the pGaN layer. The vertical line corresponds to the bottom of the barrier layer 3. The broken-line curve corresponds to a manufacturing process devoid of maintenance of the atmosphere of the epitaxy chamber with magnesium before the deposition by epitaxy of the pGaN layer. The dotted-line curve corresponds to a manufacturing process in which the atmosphere of the epitaxy chamber is maintained with magnesium for a period of time of 30 seconds before the deposition by epitaxy of the pGaN layer. The dash-dotted-line curve corresponds to a manufacturing process in which the atmosphere of the epitaxy chamber is maintained with magnesium for a period of time of 90 seconds before the deposition by epitaxy of the pGaN layer. The continuous-line curve corresponds to a manufacturing process in which the atmosphere of the epitaxy chamber is maintained with magnesium for a period of time of 120 seconds before the deposition by epitaxy of the pGaN layer. It is found that the more the atmosphere is maintained with magnesium for a long time before entering the epitaxy conditions, the steeper is the magnesium concentration front at the bottom of the barrier layer 3.

The examples have been described in an application with the inclusion of a dopant of Mg type in the embedded barrier layer. An identical problem is encountered with the growth of GaN doped with Fe, which is used to render the GaN layers insulating for applications of very-high-frequency transistors. For all of the stages described in detail above, the Mg can be replaced with Fe in the context of the invention in order to better control the growth of these doped layers.

The invention claimed is:

1. A process for the manufacture of a heterojunction electronic component provided with an embedded barrier layer, comprising the stages of:
   depositing by epitaxy, on a substrate positioned in a vapour phase epitaxial growth chamber, with an atmosphere in the chamber exhibiting a first nonzero ammonia concentration, of a GaN precursor layer of the embedded barrier layer, this precursor layer comprising a first layer doped with a dopant which is Mg or Fe, the deposition by epitaxy of the GaN precursor layer comprising a deposition by epitaxy, on the first layer doped with the said dopant, of a GaN second layer in an atmosphere in the chamber not fed with the said dopant;
   while maintaining the substrate in the epitaxial growth chamber, placing the atmosphere inside the chamber at a second ammonia concentration at most equal to a third of the first concentration, so to remove an upper part of the precursor layer, the removal of the upper part of the precursor layer comprising the complete removal of the GaN second layer; then
   after the removal of the said upper part of the precursor layer, while maintaining the substrate in the epitaxial growth chamber, depositing by epitaxy, on the said precursor layer, of a layer of semiconductor material of the heterojunction electronic component to be manufactured, the said precursor layer then forming the embedded barrier layer under the said layer of semiconductor material.

2. The process for the manufacture of a heterojunction electronic component according to claim 1, in which an ammonia partial pressure at least equal to 200 Pa is maintained in the chamber during the removal of the upper part of the precursor layer.

3. The process for the manufacture of a heterojunction electronic component according to claim 1, in which the said removal is carried out with an atmosphere in the chamber comprising molecular hydrogen.

4. The process for the manufacture of a heterojunction electronic component according to claim 1, in which the said removal is carried out with an atmosphere in the chamber which contains $Cl_2$ or HCl.

5. The process for the manufacture of a heterojunction electronic component according to claim 1, comprising the repetition of the said stage of removal of the upper part of the precursor layer, the process additionally comprising, between two of the said repeated removal stages, a stage of growth by epitaxy of a GaN layer on the said precursor layer, in an atmosphere in the chamber not fed with the said dopant.

6. The process for the manufacture of a heterojunction electronic component according to claim 1, in which the said stage of deposition by epitaxy of the precursor layer is preceded by a stage of saturation of the surface of the layer with the said dopant.

7. The process for the manufacture of a heterojunction electronic component according to claim 1, in which the said stage of removal of the upper part of the precursor layer comprises the placing of the atmosphere inside the chamber at an ammonia concentration at most equal to a third of an ammonia concentration in the atmosphere of the deposition by epitaxy of the GaN precursor layer of the embedded barrier layer.

8. The process for the manufacture of a heterojunction electronic component according to claim 1, in which the said stage of removal removes a thickness of at least 20 nm from the said precursor layer.

\* \* \* \* \*